(12) United States Patent
Arora et al.

(10) Patent No.: US 8,742,798 B2
(45) Date of Patent: Jun. 3, 2014

(54) METHOD AND APPARATUS FOR LOCAL OSCILLATION DISTRIBUTION

(75) Inventors: Himanshu Arora, Plano, TX (US); Paolo Rossi, Pavia (IT); Jae Yong Kim, Santa Clara, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/479,977

(22) Filed: May 24, 2012

(65) Prior Publication Data

US 2012/0306547 A1 Dec. 6, 2012

Related U.S. Application Data

(60) Provisional application No. 61/492,974, filed on Jun. 3, 2011.

(51) Int. Cl.
*H02M 11/00* (2006.01)
*H03F 3/45* (2006.01)

(52) U.S. Cl.
USPC ............ 327/103; 327/119; 327/120; 455/75; 455/76; 455/77

(58) Field of Classification Search
USPC ................ 327/103, 119, 120; 455/75, 76, 77
See application file for complete search history.

(56) References Cited

U.S. PATENT DOCUMENTS

| | | | | |
|---|---|---|---|---|
| 7,558,538 B2 * | 7/2009 | Carrez | ........................ | 455/112 |
| 8,044,733 B1 * | 10/2011 | Arora et al. | ............ | 331/117 FE |
| 2005/0239417 A1 | 10/2005 | Boos | | |
| 2007/0173286 A1 * | 7/2007 | Carter et al. | ............... | 455/553.1 |
| 2008/0136463 A1 * | 6/2008 | Chang et al. | ................. | 327/103 |
| 2008/0311860 A1 | 12/2008 | Tanaka et al. | | |
| 2011/0043291 A1 | 2/2011 | Fagg | | |

OTHER PUBLICATIONS

Shibasaki, T., et al., "20-GHz Quadrature Injection-Locked LC Dividers with Enhanced Locking Range," *IEEE Journal of Solid-State Circuits,* IEEE Service Center, Piscataway, NJ, vol. 43, No. 3, Mar. 1, 2008, pp. 610-618, XP011204874.
International Search Report and Written Opinion of International Searching Authority, mailed Aug. 30, 2012 in counterpart International Application No. PCT/US2012/039298.

* cited by examiner

*Primary Examiner* — John Poos

(57) ABSTRACT

A circuit includes an oscillation generation circuit, a distribution circuit, and a transceiver circuit. The oscillation generation circuit is configured to generate a first oscillation signal having a first frequency. The distribution circuit includes a voltage to current stage, a transmission portion and a current to voltage stage. The voltage to current stage is configured to receive the first oscillation signal, and convert the first oscillation signal into a current form. The transmission portion is configured to transmit the first oscillation signal in the current form. The current to voltage stage is configured to receive the first oscillation signal in the current form and generate a second oscillation signal having a subharmonic frequency of the first frequency, such as half of the first frequency. The transceiver circuit is configured to operate in a frequency band responsive to the second oscillation signal.

20 Claims, 4 Drawing Sheets

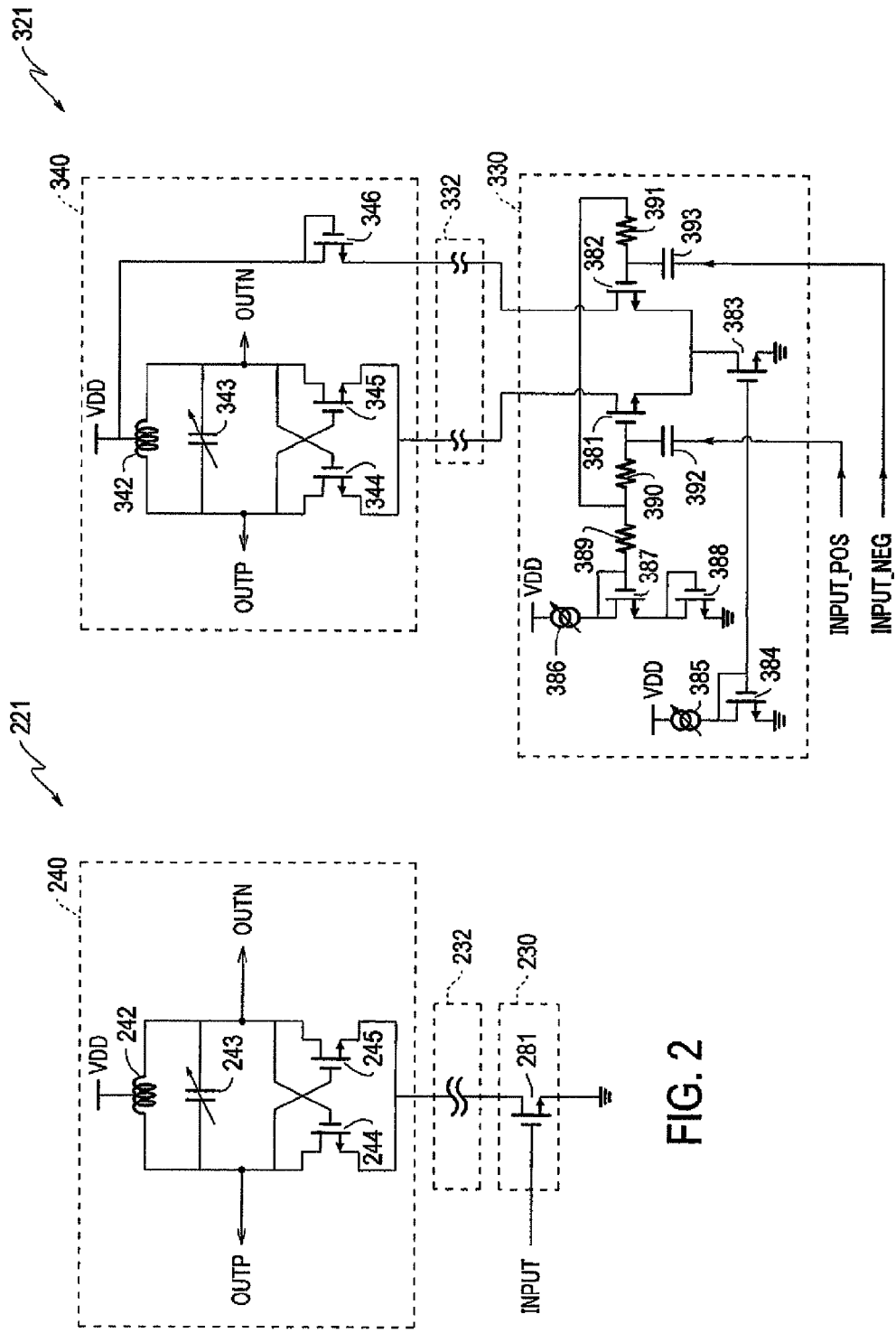

US 8,742,798 B2

METHOD AND APPARATUS FOR LOCAL OSCILLATION DISTRIBUTION

INCORPORATION BY REFERENCE

This present disclosure claims the benefit of U.S. Provisional Application No. 61/492,974, "Power Efficient LO Distribution Scheme Realizing Divide-By-2 By Reusing LO Distribution Gm Driver Stage," filed on Jun. 3, 2011, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Some wireless communication systems can operate in multiple radio frequency (RF) bands. In an example, a communication system includes a first transceiver that operates at about 2.4 GHz, and a second transceiver that operates at about 5 GHz. The communication system can select one of the two transceivers to achieve better wireless communication performance.

SUMMARY

Aspects of the disclosure provide a circuit. The circuit includes an oscillation generation circuit, a first distribution circuit, and a first transceiver circuit. The oscillation generation circuit is configured to generate a first oscillation signal having a first frequency. The first distribution circuit includes a first voltage to current stage, a first transmission portion and a first current to voltage stage. The first voltage to current stage is configured to receive the first oscillation signal, and convert the first oscillation signal into a current form. The first transmission portion is configured to transmit the first oscillation signal in the current form. The first current to voltage stage is configured to receive the first oscillation signal in the current form and generate a second oscillation signal having a sub-harmonic frequency of the first frequency, such as half of the first frequency. The first transceiver circuit is configured to operate in a first frequency band responsive to the second oscillation signal.

In an example, the circuit is implemented on an integrated circuit (IC) chip, and is used in an electronic system, such as a wireless communication system.

In an embodiment, the first current to voltage stage includes an LC oscillator to oscillate at the sub-harmonic frequency of the first frequency to convert the second oscillation signal into a voltage form. Further, the first current to voltage stage includes transistors configured in a cross-coupled differential pair topology to receive the first oscillation signal in the current form to power the LC oscillator.

According to an embodiment of the disclosure, the first voltage to current stage has a differential topology. Further, the first transmission portion is configured to transmit the first oscillation signal in the current form over a distance longer than a distance threshold, such as two millimeters, and the like.

According to an aspect of the disclosure, the circuit includes a second distribution circuit and a second transceiver. The second distribution circuit includes a second voltage to current stage configured to receive the first oscillation signal, and convert the first oscillation signal into a current form, a second transmission portion configured to transmit the first oscillation signal in the current form, and a second current to voltage stage configured to receive the first oscillation signal in the current form, generate a third oscillation signal having the first frequency. The second transceiver circuit is configured to operate in a second frequency band responsive to the third oscillation signal.

According to another aspect of the disclosure, the circuit is configured to support multiple-input multiple-output (MIMO) operation. The circuit includes a third distribution circuit, and a third transceiver. The third distribution circuit includes a third voltage to current stage configured to receive the first oscillation signal, and convert the first oscillation signal into a current form, a third transmission portion configured to transmit the first oscillation signal in the current form, and a third current to voltage stage configured to receive the first oscillation signal in the current form, generate a fourth oscillation signal having the sub-harmonic frequency of the first frequency. The third transceiver circuit is configured to operate in a first frequency band responsive to the fourth oscillation signal.

Aspects of the disclosure provide a method. The method includes converting, by an injection stage of an injection-locked frequency divider (ILFD), a first oscillation signal from a voltage form to a current form, transmitting the first oscillation signal in the current form over a distance that is longer than a threshold distance within the ILFD; and generating, by an oscillation stage of the ILFD, a second oscillation signal having a sub-harmonic frequency of the first frequency, such as half the first frequency.

Further, the method includes generating the first oscillation signal using a phase-locked loop circuit. In an embodiment, the method includes operating in a frequency band responsive to the second oscillation signal.

In an example, to generate the second oscillation signal, the method includes current-driving a cross-coupled differential pair coupled with an LC oscillator configured to oscillate at the sub-harmonic frequency.

BRIEF DESCRIPTION OF THE DRAWINGS

Various embodiments of this disclosure that are proposed as examples will be described in detail with reference to the following figures, wherein like numerals reference like elements, and wherein:

FIG. 2 shows a circuit diagram of a local oscillation (LO) distribution circuit example 221 according to an embodiment of the disclosure;

FIG. 3 shows a circuit diagram of an LO distribution circuit example 321 according to an embodiment of the disclosure;

DETAILED DESCRIPTION OF EMBODIMENTS

Figure 1:
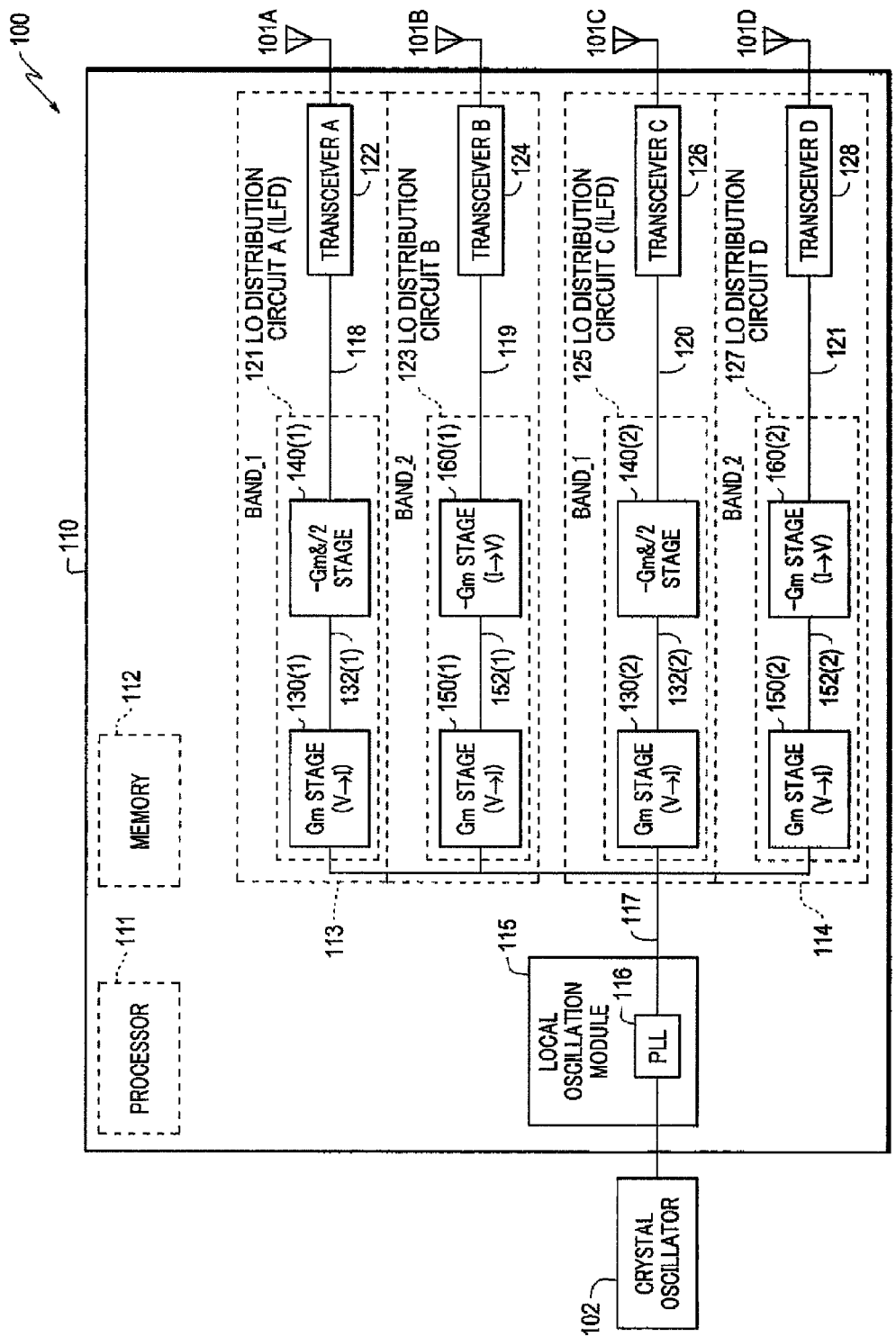
FIG. 1 shows a block diagram of an electronic system example 100 according to an embodiment of the disclosure.

FIG. 1 shows a block diagram of an electronic system example 100 according to an embodiment of the disclosure. The electronic system 100 includes a crystal oscillator 102 and a circuit 110 coupled together as shown in FIG. 1. The circuit 110 is configured to generate a first oscillation signal based on the crystal oscillator 102, and to generate a second oscillation signal having a frequency that is a fraction of the first oscillation signal frequency. According to an aspect of the disclosure, the electronic system 100 does not use a current mode logic (CML) frequency divider to frequency-divide the first oscillation signal in order to generate the second oscillation signal. Generally, a CML divider consumes relatively large power. Without using the CML divider, the electronic system 100 saves power. In an example, a CML divider consumes more than 1 mA current during operation. Without using the CML divider, the current consumption of the electronic system 100 can be reduced by 1 mA, for example.

The electronic system 100 can be any suitable electronic system that needs frequency division. In an embodiment, the electronic system 100 includes a wireless communication system, such as a Wi-Fi communication system that is suitable for use in a wireless local area network (WLAN). For example, the electronic system 100 includes a plurality of antennas 101A-101D configured to transmit and/or receive wireless signals. In an example, the Wi-Fi communication system is configured to be compliant with multiple wireless standards, and is operative at multiple frequencies, such as a relatively high frequency about 5 GHz (e.g., between 4,915 MHz and 5,825 MHz) that is compliant to 802.11a standard, and a relatively low frequency about 2.4 GHz (e.g., between 2,412 MHz and 2,484 MHz) that is compliant to 802.11b/g standards to improve performance and/or flexibility, for example. The wireless communication system can use a frequency division technique to frequency-divide the relatively high frequency, such as about 5 GHz, to generate the relatively low frequency, such as about 2.4 GHz.

The crystal oscillator 102 is configured to generate an oscillation signal having a relatively stable frequency to provide a frequency reference to the electronic system 100.

According to an aspect of the disclosure, the circuit 110 is implemented as an integrated circuit (IC) chip coupled with other suitable circuit components (not shown), such as discrete circuit components, other IC chips, and the like to perform required functions.

In the FIG. 1 example, the circuit 110 includes a local oscillation module 115 configured to generate a local oscillation signal 117, and a dual-band wireless communication module 113. The dual-band wireless communication module 113 includes a first band portion BAND_1 configured to be operative in a first frequency band, such as about 2.4 GHz, and a second band portion BAND_2 configured to be operative in a second frequency band, such as about 5 GHz.

The local oscillation module 115 is coupled to the crystal oscillator 102 to generate the local oscillation signal 117 based on the crystal oscillator 102. In an embodiment, the local oscillation module 115 includes a phase-locked loop (PLL) 116 configured to phase-lock the local oscillation signal 117 to the oscillation signal generated by the crystal oscillator 102, such that the frequency of the local oscillation signal 117 is relatively stable. In an example, the frequency of the oscillation signal generated by the crystal oscillator 102 is in the range of 3,216 MHz to 3,883 MHz. The local oscillation module 115 includes an offset mixer (not shown) to generate the local oscillation signal 117 having a relatively high frequency, such as about 5 GHz in the range of 4,824 MHz to 5,824 MHz.

According to an aspect of the disclosure, the first band portion BAND_1 includes a transceiver A 122 and a local oscillation (LO) distribution circuit A 121, and the second band portion BAND_2 includes a transceiver B 124 and a LO distribution circuit B 123. The LO distribution circuit A receives the local oscillation signal 117 having the relatively high frequency about 5 GHz, generates and provides a first transceiver oscillation signal 118 having a relatively low frequency about 2.4 GHz to the transceiver A. The transceiver A is configured to be operative based the first transceiver oscillation signal 118.

The LO distribution circuit B receives the local oscillation signal 117 having the relatively high frequency about 5 GHz, and provides a second transceiver oscillation signal 119 having a relatively high frequency about 5 GHz to the transceiver B. The transceiver B is configured to be operative based on the second transceiver oscillation signal 119.

In an embodiment, the transceiver A includes an up-conversion module (not shown) that converts a baseband signal or an intermediate frequency (IF) signal into a radio frequency (RF) signal for transmission based on the first transceiver oscillation signal 118, and/or a down-conversion module (not shown) that converts a received RF signal into a baseband signal or an IF signal based on the first transceiver oscillation signal 118. The transceiver 13 includes an up-conversion module (not shown) that converts a baseband signal or an (IF) signal into a RF signal for transmission based on the second transceiver oscillation signal 119, and/or a down-conversion module (not shown) that converts a received RF signal into a baseband signal or an IF signal based on the second transceiver oscillation signal 119.

According to an aspect of the disclosure, the LO distribution circuit A includes an injection locked frequency divider (ILFD) to frequency-divide the local oscillation signal 117 to generate the first transceiver oscillation signal 118, and the ILFD reuses a portion of circuits for LO distribution. In an embodiment, the LO distribution circuit A includes a GM stage 130(1) that is the injection stage of the ILFD, a –GM & /2 stage 140(1) that is the oscillation stage of the ILFD, and a transmission portion 132(1) that couples the injection stage of the ILFD and the oscillation stage of the ILFD.

The Gm stage 130(1) is configured to receive the local oscillation signal 117, and convert the local oscillation signal 117 from a voltage form into a current form. According to an embodiment of the disclosure, the transceiver A is located with a relatively large distance, such as over a plurality of millimeters, from the local oscillation module 115 in the IC chip. The transmission portion 132(1) is configured to transmit the local oscillation signal 117 in the current form over the relatively large distance. The –Gm & /2 stage 140(1) is configured to receive the local oscillation signal 117 in the current form, generate the first transceiver oscillation signal 118 in the voltage form, and provide the first transceiver oscillation signal 118 in the voltage form to the transceiver A. The first transceiver oscillation signal 118 has a sub-harmonic frequency of the local oscillation signal 117, such as about one half frequency of the local oscillation signal 117, and the like.

The LO distribution circuit B is configured for LO distribution. In an embodiment, the LO distribution circuit B includes a Gm stage 150(1), a transmission portion 152(1), and a –Gm 160(1) coupled together to distribute the local oscillation signal 117 in a current form. The Gm stage 150(1) is configured to receive the local oscillation signal 117, and convert the local oscillation signal 117 in a current form. The transmission portion 152(1) is configured to transmit the local oscillation signal 117 in the current form over a relatively large distance. The –Gm stage 160(1) is configured to receive the local oscillation signal 117 in the current form, and generate the second transceiver oscillation signal 119 in the voltage form. The second transceiver oscillation signal 119 has about the same frequency as the local oscillation signal 117.

It is noted that the circuit 110 can include other suitable circuits, such as a processor 111, a memory circuit 112, and the like. In an example, the circuit 110 is configured to support multiple-input and multiple-output (MIMO) technology. The circuit 110 includes a plurality of dual band wireless communication modules 113-114. Each of the dual band wireless communication modules 113-114 can be similarly configured as the dual band wireless communication module 113; the description has been provided above and will be omitted here for clarity purposes.

FIG. 2 shows a circuit diagram of an LO distribution circuit example 221 according to an embodiment of the disclosure. The LO distribution circuit 221 includes a Gm stage 230, a transmission portion 232, and a −Gm & /2 stage 240. The Gm stage 230, the transmission portion 232, and the −Gm & /2 stage 240 are coupled into an ILFD as shown in FIG. 2 to perform frequency division and signal distribution.

The Gm stage 230 is configured to receive an input signal INPUT that is an oscillation signal in the voltage form, and convert the oscillation signal in a current form. In the FIG. 2 example, the Gm stage 230 includes a transistor, such as a N-type metal-oxide-semiconductor (MOS) transistor 281. The N-type MOS transistor 281 receives INPUT at gate terminal, and the source and drain terminals are respectively coupled to a power supply, such as Ground, and the transmission portion 232. Thus, the current flowing through the drain and source terminal is controlled by the voltage level of INPUT, and thus is an oscillation signal in the current form.

The transmission portion 232 is configured to transmit the oscillation signal in the current form over a relatively large distance. According to an embodiment of the disclosure, the transmission portion 232 includes a relatively long wire path that transmits the oscillation signal in the current form.

The −Gm & /2 stage 240 is configured to receive the oscillation signal in the current form, and generate a pair of differential output signals (OUTP and OUTN) in the voltage form. OUTP and OUTN are oscillation signals having a sub-harmonic frequency of the input signal INPUT, such as about one half frequency of the input signal INPUT.

In the FIG. 2 example, the −Gm & /2 stage 240 includes a pair of N-type MOS transistors 244 and 245, an inductor module 242 and an adjustable capacitor module 243. These elements are coupled together as shown in FIG. 2.

The inductor module 242 includes one or more inductor structures. In an example, the supply voltage VDD is coupled to a balance point, such as a center of the inductor module 242. The inductor structures can be constructed on the IC chip or can be off-chip structures. The adjustable capacitor module 243 includes one or more capacitors that the collective capacitance can be suitably adjusted. In an example, the adjustable capacitor module 243 includes a varactor that the capacitance of the varactor can be adjusted. In another example, the adjustable capacitor module 243 includes a plurality of selectable capacitors that each of them can be individually selected in or out of the circuit.

The inductor module 242 and the adjustable capacitor module 243 are coupled together to form an LC type oscillator, and the oscillation frequency of the LC oscillator is determined by the inductance of the inductor module 242 and the capacitance of the adjustable capacitor module 243.

The pair of N-type MOS transistors 244 and 245 is cross-coupled together. Specifically, the source terminals of the pair of N-type MOS transistors 244 and 245 are coupled together and to the transmission portion 232. The gate terminal of the N-type MOS transistor 244 is coupled to the drain terminal of the N-type MOS transistor 245, and the gate terminal of the N-type MOS transistor 245 is coupled to the drain terminal of the N-type transistor 244. The inductor module 242 and the adjustable capacitor module 243 are coupled between the drain terminal of the N-type MOS transistor 244 and the drain terminal of the N-type MOS transistor 245. OUTP and OUTN are output from the drain terminals of the N-type MOS transistors 244 and 245.

According to an embodiment of the disclosure, the oscillation frequency of OUTN and OUTP depends on the LC oscillator and the LC oscillator is configured as a filter to select a desired oscillation frequency. In an example, the adjustable capacitor module 243 is suitably adjusted to change the capacitance of the LC oscillator, and thus change the oscillation frequency of OUTN and OUTP. For example, the adjustable capacitor module 243 is adjusted to select an oscillation frequency about 2.4 GHz, such as an oscillation frequency between 2,412 MHz and 2,484 MHz. In an embodiment, the LC oscillator is configured to have a relatively large Q factor that is proportional to selectivity, such that the LC oscillator has a relatively high frequency selectivity, and the LO distribution circuit 221 has a relatively high spur rejection.

FIG. 3 shows a circuit diagram of an LO distribution circuit example 321 according to an embodiment of the disclosure. The LO distribution circuit 321 includes a Gm stage 330, a transmission portion 332, and a −Gm & /2 340. The Gm stage 330, the transmission portion 332, and the −Gm & /2 stage 340 are coupled into an ILFD as shown in FIG. 3 to perform frequency division and signal distribution. The LO distribution circuit 321 can be used in the FIG. 1 example as the LO distribution circuit A 121.

The Gm stage 330 is configured to receive a pair of input signals INPUT_POS and INPUT_NEG and convert the input signals from a voltage form into a current form. The pair of input signals INPUT_POS and INPUT_NEG is a pair of differential oscillation signals in the voltage form. In the FIG. 3 example, the Gm stage 330 is configured in a differential manner to operate on the pair of input signals.

Specifically, the Gm stage 330 includes a pair of N-type MOS transistors 381 and 382. The pair of N-type MOS transistors 381 and 382 is coupled together in a differential topology, and the pair of input signals INPUT_POS and INPUT_NEG is AC-coupled to the gate terminals of the N-type MOS transistors 381 and 382. The source terminals of the pair of N-type MOS transistors 381 and 382 are coupled to a current bias circuit, and the drain terminals of the pair of N-type transistors 381 and 382 are coupled to the transmission portion 332.

According to an embodiment of the disclosure, the Gm stage 330 includes the current bias circuit to provide a relatively constant current that is substantially independent of the pair of input signals INPUT_POS and INPUT_NEG, and a DC bias circuit to bias the N-type MOS transistors 381 and 382 in a suitable operating region, such as a saturation region.

In the FIG. 3 example, the current bias circuit includes a reference current source 385 and N-type MOS transistors 384 and 383 coupled together in a current mirror. The current provided by the current bias circuit depends on the reference current source 385 and a width/length ratio between the N-type MOS transistors 383 and 384, and is independent of the pair of input signals INPUT_POS and INPUT_NEG.

In the FIG. 3 example, the DC bias circuit includes a reference current source 386, two N-type MOS transistors 387 and 388, and resistors 389-391. The two N-type MOS transistors 387 and 388 are respectively configured in a diode-connected topology, and are serially connected with the reference current source 386. The voltage at the drain/gate terminal of the N-type MOS transistor 387 depends on the current level of the reference current source 386, and the sizes of the two N-type MOS transistors 387 and 388. The resistors 389-391 provide the voltage at the drain/gate terminal of the N-type MOS transistor 387 to DC bias the gate terminals of the N-type transistors 381 and 382. In addition, the pair of input signals INPUT_POS and INPUT_NEG is AC-coupled to the gate terminals of the N-type MOS transistors 381 and 382 via capacitors 392 and 393. Thus, the current flowing through the drain terminal of the N-type MOS transistor 381 and the current flowing through the drain terminal of the N-type MOS transistor 382 are controlled by the pair of input signals INPUT_POS and INPUT_NEG, and form a pair of differential oscillation signals in the current form corresponding to the pair of input signals INPUT_POS and INPUT_NEG.

The transmission portion 332 is configured to transmit the pair of differential oscillation signals in the current form over a relatively large distance. According to an embodiment of the disclosure, the transmission portion 332 includes two relatively long wire paths that transmit the pair of differential oscillation signals in the current form.

The –Gm & /2 stage 340 is configured to receive the pair of differential oscillation signals in the current form, and generate a pair of differential output signals (OUTP and OUTN) in the voltage form. OUTP and OUTN are oscillation signals having a sub-harmonic frequency of INPUT_POS and INPUT_NEG, such as about one half frequency of INPUT INPUT_POS and INPUT_NEG.

In the FIG. 3 example, the –Gm & /2 stage 340 utilizes certain components, such as inductor module 342, adjustable capacitor module 343, and cross-coupled N-type MOS transistors 344 and 345 that are identical or equivalent to those used in –Gm & /2 stage 240; the description of these components has been provided above and will be omitted here for clarity purposes.

The inductor module 342, the adjustable capacitor module 343, and the cross-coupled N-type MOS transistors 344 and 345 are coupled together as a load for one of the two wire paths. The –Gm & /2 stage 340 includes a N-type MOS transistor 346 configured as a diode-connection load for the other wire path. In an example, the width/length ratio of the N-type MOS transistor 346 is twice of the width/length ratio of each of the cross-coupled N-type MOS transistors 344 and 345. Thus, the loads to the two wire paths are about the same and substantially balanced.

According to an implementation example, the OUTN and OUTP of the LO distribution circuit example 321 can achieve 750 mV single ended peak to peak (sepp) value that is higher than a comparison example that uses CML divider.

According to an aspect of the disclosure, the LO distribution circuit 321 also has better spur rejection due to the nature of the LC oscillator.

Figure 4:
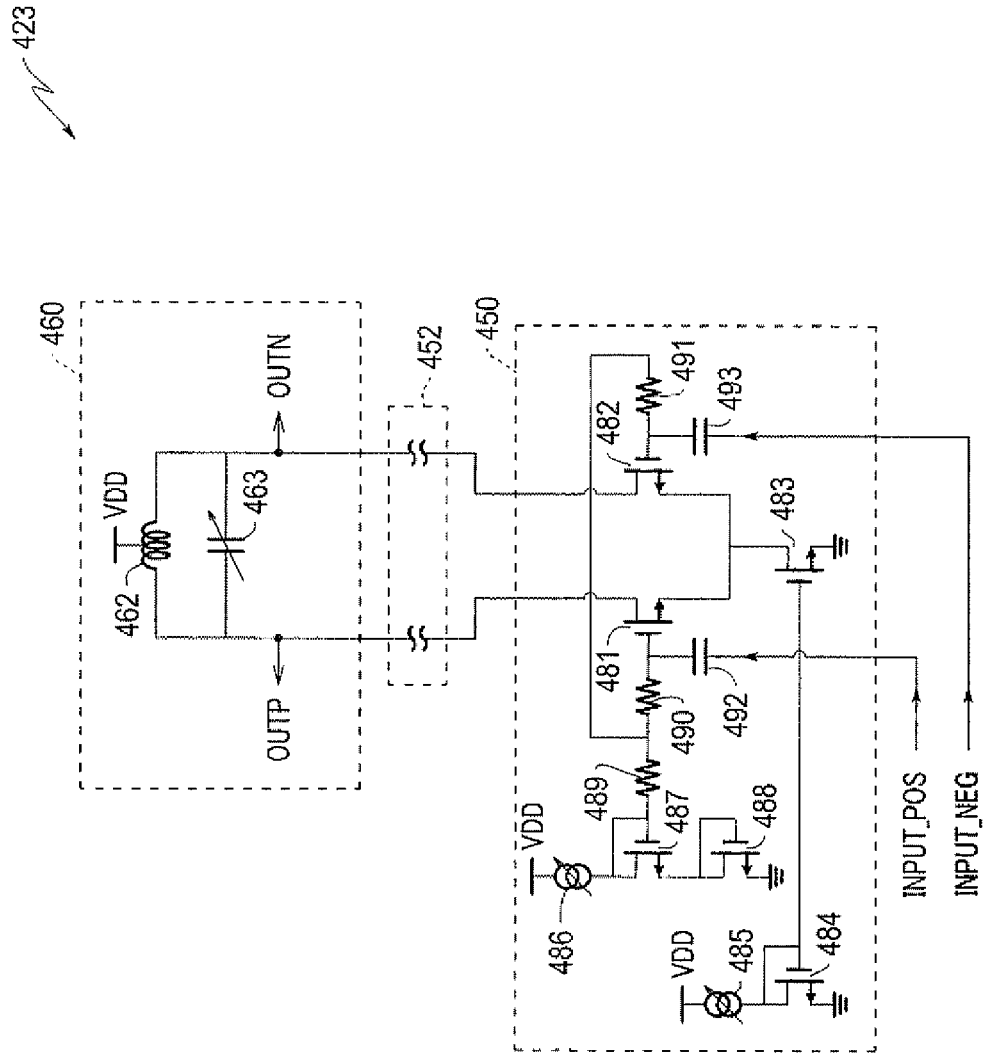
FIG. 4 shows a schematic diagram of an LO distribution circuit example 423 according to an embodiment of the disclosure.

FIG. 4 shows a circuit diagram of a LO distribution circuit example 423 according to an embodiment of the disclosure. The LO distribution circuit 423 includes a Gm stage 450, a transmission portion 452, and a –Gm 460 coupled together as shown in FIG. 4. The LO distribution circuit 423 can be used in the FIG. 1 example as the LO distribution circuit B 123 to perform signal distribution.

The Gm stage 450 utilizes certain components that are identical or equivalent to those used in the Gm stage 330 in FIG. 3; the description of these components has been provided above and will be omitted here for clarity purposes.

The transmission portion 452 utilizes certain components that are identical or equivalent to those used in the transmission portion 332 in FIG. 3; the description of these components has been provided above and will be omitted here for clarity purposes.

The –Gm stage 460 is configured to receive the pair of differential oscillation signals in the current form, and generate a pair of differential output signals (OUTP and OUTN) in the voltage form. OUTP and OUTN are oscillation signals having about the same frequency of INPUT_POS and INPUT_NEG.

In the FIG. 4 example, the –Gm stage 460 includes an inductor module 462 and an adjustable capacitor module 463 coupled between the two wire paths at an end of the transmission portion 452. The inductor module 462 and the adjustable capacitor module 463 are similarly configured as the inductor module 242 and the adjustable capacitor module 243; the description of these components has been provided above and will be omitted here for clarity purposes.

According to an embodiment of the disclosure, the oscillation frequency of OUTN and OUTP depends on the LC oscillator and the LC oscillator is configured as a filter to select a desired oscillation frequency. In an example, the adjustable capacitor module 463 is suitably adjusted to change the capacitance of the LC oscillator, and thus change the oscillation frequency of OUTN and OUTP. For example, the adjustable capacitor module 463 is adjusted to select an oscillation frequency about 5 GHz, such as an oscillation frequency between 4,915 MHz and 5,825 MHz. In an embodiment, the LC oscillator is configured to have a relatively large Q factor that is proportional to selectivity, such that the LC oscillator has a relatively high frequency selectivity.

It is noted that a Gm stage that converts a signal from a voltage form to a current form is generally needed for distributing signals over a relatively long distance, such as in the FIG. 4 example. In the FIG. 3 example, the LO distribution circuit 321 includes an ILFD that re-uses a portion of the distribution circuit, such as the Gm stage, and is configured to perform both signal distribution and frequency-division.

It is noted that while the examples of FIGS. 2-4 use N-type MOS transistors in the LO distribution circuits, the LO distribution circuits can be suitably adjusted to use any other suitable transistors, such P-type MOS transistors, bipolar transistors, and the like.

Figure 5:
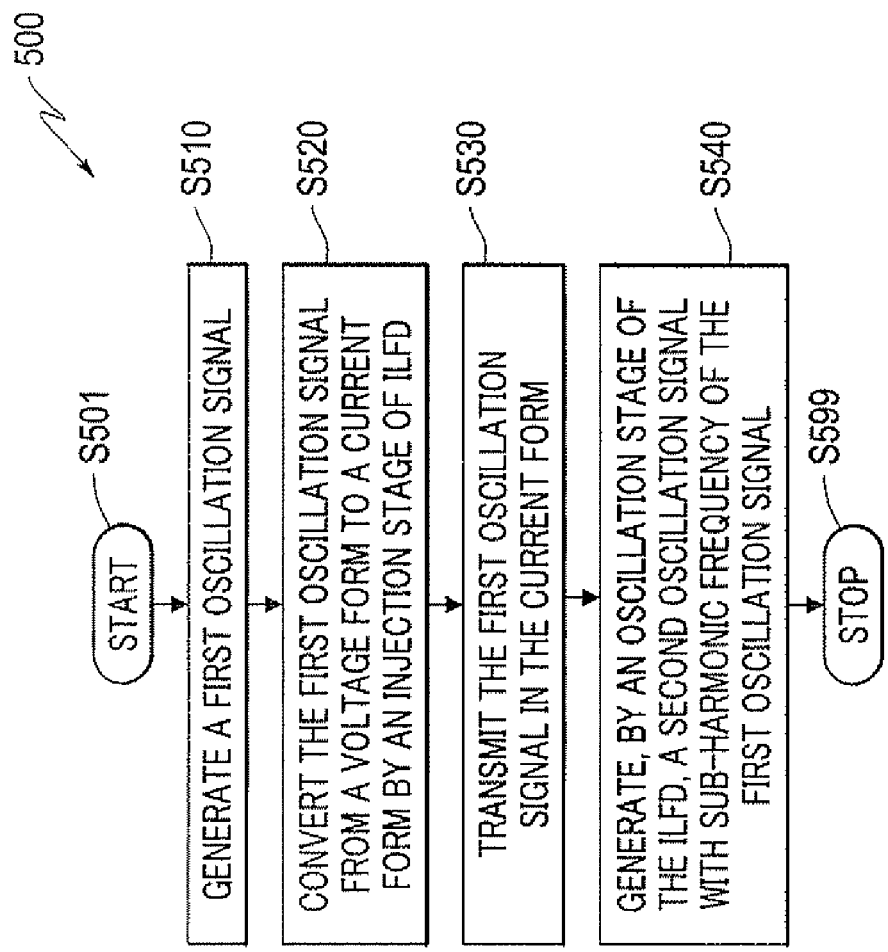
FIG. 5 shows a flow chart outlining a process example 500 according to an embodiment of the disclosure.

FIG. 5 shows a flow chart outlining a process example 500 for local oscillation (LO) distribution in the electronic system 100 according to an embodiment of the disclosure. The electronic system 100 includes the circuit 110, such as an integrated circuit (IC) chip 110. The IC chip 110 includes various circuits, such as the transceivers A-D that are configured to be operative at different frequencies, and the like. The IC chip 110 includes the local oscillation module 115 configured to generate a local oscillation signal 117 having a relatively high frequency, such as about 5 GHz. The IC chip 110 also includes the LO distribution circuits 121, 123, 125 and 127 configured to distribute and provide suitable oscillation signals, such as an oscillation signal of 5 GHz, an oscillation signal of 2.4 GHz, to the transceivers A-D, for example. Some of the LO distribution circuits, such as the LO distribution circuit 121, are configured into an ILFD and can execute the process 500 to distribute the oscillation signal and frequency-divide the oscillation signal. The process starts at S501, and proceeds to S510.

At S510, the local oscillation module 115 generates a first oscillation signal. The first oscillation signal has a relatively high frequency, such as about 5 GHz, that is suitable for the transceivers B and D. In an example, the first oscillation signal is distributed to the transceiver B and/or transceiver D using the LO distribution circuit 423, for example.

At S520, the Gm stage 130(1) of the LO distribution circuit 121, which is also the injection stage of the ILFD, converts the first oscillation signal from a voltage form to a current form.

At S530, the first oscillation signal is transmitted in the current form by the transmission portion 132(1) of the LO distribution circuit 121.

At S540, the −Gm & /2 stage 140(1) of the LO distribution circuit 121, which is also the oscillation stage of the ILFD, receives the first oscillation signal in the current form, generate a second oscillation signal with sub-harmonic frequency of the first oscillation signal, such as about one half the frequency of the first oscillation signal, and provide the second oscillation signal in the voltage form to the transceiver A. Then, the process proceeds to S599 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
   an oscillation generation circuit configured to generate a first oscillation signal having a first frequency;
   a first distribution circuit that includes:
      a first voltage to current stage configured to receive the first oscillation signal, and convert the first oscillation signal into a current form,
      a first transmission portion configured to transmit the first oscillation signal in the current form, and
      a first current to voltage stage configured to receive the first oscillation signal in the current form, generate a second oscillation signal having a sub-harmonic frequency of the first frequency; and
   a first transceiver circuit configured to operate in a first frequency band responsive to the second oscillation signal.

2. The circuit of claim 1, wherein the first current to voltage stage is configured to generate the second oscillation signal at half the first frequency.

3. The circuit of claim 1, wherein the first current to voltage stage includes an LC oscillator to oscillate at the sub-harmonic frequency of the first frequency to convert the second oscillation signal into a voltage form.

4. The circuit of claim 3, the first current to voltage stage includes transistors configured in a cross-coupled differential pair topology to receive the first oscillation signal in the current form to power the LC oscillator.

5. The circuit of claim 1, wherein the first voltage to current stage has a differential topology.

6. The circuit of claim 1, wherein the first transmission portion is configured to transmit the first oscillation signal in the current form over a distance longer than a distance threshold.

7. The circuit of claim 1, further comprising:
   a second distribution circuit that includes:
      a second voltage to current stage configured to receive the first oscillation signal, and convert the first oscillation signal into a current form,
      a second transmission portion configured to transmit the first oscillation signal in the current form, and
      a second current to voltage stage configured to receive the first oscillation signal in the current form, generate a third oscillation signal having the first frequency; and
   a second transceiver circuit configured to operate in a second frequency band responsive to the third oscillation signal.

8. The circuit of claim 1, further comprising:
   a third distribution circuit that includes:
      a third voltage to current stage configured to receive the first oscillation signal, and convert the first oscillation signal into a current form,
      a third transmission portion configured to transmit the first oscillation signal in the current form, and
      a third current to voltage stage configured to receive the first oscillation signal in the current form, generate a fourth oscillation signal having the sub-harmonic frequency of the first frequency; and
   a third transceiver circuit configured to operate in a first frequency band responsive to the fourth oscillation signal.

9. A method, comprising:
   converting, by an injection stage of an injection-locked frequency divider (ILFD), a first oscillation signal from a voltage form to a current form;
   transmitting the first oscillation signal in the current form over a distance that is longer than a threshold distance within the ILFD; and
   generating, by an oscillation stage of the ILFD, a second oscillation signal having a sub-harmonic frequency of the first frequency.

10. The method of claim 9, further comprising:
    generating the first oscillation signal using a phase-locked loop circuit.

11. The method of claim 9, further comprising:
    operating in a frequency band responsive to the second oscillation signal.

12. The method of claim 9, wherein generating, by the oscillation stage of the ILFD, the second oscillation signal having the sub-harmonic frequency of the first frequency further comprises:
    generating the second oscillation signal at half the first frequency.

13. The method of claim 9, wherein generating, by the oscillation stage of the ILFD, the second oscillation signal having the sub-harmonic frequency of the first frequency further comprises:
    current-driving a cross-coupled differential pair coupled with an LC oscillator configured to oscillate at the sub-harmonic frequency.

14. An electronic system, comprising:
    an oscillation generation circuit configured to generate a first oscillation signal having a first frequency;
    a first distribution circuit that includes:
       a first voltage to current stage configured to receive the first oscillation signal, and convert the first oscillation signal into a current form,
       a first transmission portion configured to transmit the first oscillation signal in the current form, and
       a first current to voltage stage configured to receive the first oscillation signal in the current form, generate a second oscillation signal having a sub-harmonic frequency of the first frequency; and
    a first transceiver circuit configured to operate in a first frequency band responsive to the second oscillation signal.

15. The electronic system of claim 14, wherein the first current to voltage stage is configured to generate the second oscillation signal at half the first frequency.

16. The electronic system of claim 14, wherein the first current to voltage stage includes an LC oscillator to oscillate at the sub-harmonic frequency of the first frequency to convert the second oscillation signal into a voltage form.

17. The electronic system of claim 16, the first current to voltage stage includes transistors configured in a cross-coupled differential pair topology to receive the first oscillation signal in the current form to power the LC oscillator.

18. The electronic system of claim 14, wherein the first voltage to current stage has a differential topology.

19. The electronic system of claim 14, wherein the first transmission portion is configured to transmit the first oscillation signal in the current form over a distance longer than a distance threshold.

20. The electronic system of claim 14, further comprising:
   a second distribution circuit that includes:
      a second voltage to current stage configured to receive the first oscillation signal, and convert the first oscillation signal in a current form,
      a second transmission portion configured to transmit the first oscillation signal in the current form, and
      a second current to voltage stage configured to receive the first oscillation signal in the current form, generate a third oscillation signal having the first frequency; and
   a second transceiver circuit configured to operate in a second frequency band responsive to the third oscillation signal.

\* \* \* \* \*